(12) United States Patent
Komiyama

(10) Patent No.: US 6,754,289 B2
(45) Date of Patent: Jun. 22, 2004

(54) SYNTHESIZER RECEIVER

(75) Inventor: Akinori Komiyama, Tokyo (JP)

(73) Assignee: Sony Corporation, Tokyo (JP)

(*) Notice: Subject to any disclaimer, the term of this patent is extended or adjusted under 35 U.S.C. 154(b) by 627 days.

(21) Appl. No.: 09/817,327

(22) Filed: Mar. 26, 2001

(65) Prior Publication Data

US 2001/0026597 A1 Oct. 4, 2001

(30) Foreign Application Priority Data

Mar. 29, 2000 (JP) ...................................... P2000-090078

(51) Int. Cl.[7] ............................. H04L 27/06; H03D 3/18
(52) U.S. Cl. ........................ 375/327; 375/316; 455/260; 455/183.1; 455/165.1
(58) Field of Search ................................. 375/327, 316, 375/376; 455/179.1, 180.1, 180.3, 186.1, 183.1, 165.1, 260

(56) References Cited

U.S. PATENT DOCUMENTS

| 5,564,093 A | | 10/1996 | Matsumoto | ................. 455/266 |
| 5,710,994 A | * | 1/1998 | Shiota | ......................... 455/260 |
| 5,757,860 A | * | 5/1998 | Shiota | ......................... 375/316 |

FOREIGN PATENT DOCUMENTS

| EP | 0669725 A1 | 8/1998 | ............ H04B/1/10 |
| EP | 0939496 A1 | 9/1999 | ............ H04B/1/10 |

* cited by examiner

Primary Examiner—Temesghen Ghebretinsae
(74) Attorney, Agent, or Firm—Jay H. Maioli

(57) ABSTRACT

A synthesizer receiver includes a variable bandpass filter having a variable width passband to which an intermediate frequency signal is supplied; a first detection circuit for detecting a level of an adjacent broadcast wave signal to enable supplying the detected output to the bandpass filter as a passband width control signal; a second detection circuit for detecting the received electric field intensity having a frequency counter for counting the frequency of the output signal of the variable bandpass filter; and a control circuit that checks the output detected by the second detection circuit during execution of a seek operation, controls the passband width of the variable bandpass filter to be switched to the wide band if the detected output of the second detection circuit indicates that the received electric field intensity is equal to or greater than a predetermined value, determines whether the detected output is tuned in to the broadcast wave signal based on the count value of the frequency counter, and stops the seek operation if the determination result indicates that the detected output is tuned in to the broadcast wave signal.

4 Claims, 3 Drawing Sheets

SYNTHESIZER RECEIVER

BACKGROUND OF THE INVENTION

1. Field of the Invention

This invention relates to a synthesizer receiver.

2. Description of the Related Art

A synthesizer-type FM receiver is structured so that the received frequency (tuning frequency) is changed by changing the frequency dividing ratio of a variable frequency dividing circuit of phase locked loop (PLL). Therefore, the received frequency is sought (scanned) on FM broadcast band by changing the frequency dividing ratio N continuously.

When a broadcast wave signal is received by seeking, the seeking is stopped at the received frequency, the broadcast of this received frequency at the stop of seeking can be received continuously thereafter, and as the result the broadcast station is selected automatically.

If the pass band width of an intermediate frequency circuit of an FM receiver is narrowed, then the distortion factor or channel separation becomes poor and the sound quality becomes poor. To avoid the problem, the pass band width of the intermediate frequency circuit should be widened.

However, as shown in FIG. 3 with a solid line, in the case that the pass band width FIF of an intermediate frequency circuit is wide, for example, in the case that seeking is performed sequentially for lower to higher frequencies, the seeking stops at the frequency fRX which is, for example, not a broadcast wave signal when the seeking changes to a certain frequency fRX if a broadcast wave signal SNX of high received electric field intensity exists at the adjacent frequency (fRX+Δf) because the broadcast wave signal SNX is detected.

On the other hand, for example, as shown in FIG. 3 with a broken line, in the case that the pass band width FIF of an intermediate frequency circuit is narrow, the seeking does not stop sometimes at the frequency fRX even when the seeking reaches to the frequency fRX of the broadcast wave signal SRX. In other words, if the modulation is shallow at the broadcast wave signal SRX, the energy of the signal SRX is concentrated around the frequency fRX because the frequency spectrum component is concentrated around the frequency fRX. Therefore, the broadcast wave signal SRX can be detected sufficiently at that time even through the pass band width FIF of an intermediate frequency circuit is narrow, and the seeking can be stopped at the frequency fRX.

However, for example, as shown in FIG. 4 with a broken line, if the modulation is deep at the broadcast wave signal SRX, the energy of the signal SRX is dispersed because the frequency spectrum component is dispersed. As the result, the broadcast wave signal SRX cannot be detected at that time if the pass band width FIF of an intermediate frequency circuit is narrow, and as the result the seeking does not stop sometimes at the frequency fRX.

In summary, the seeking sometimes cannot be stopped at the frequency of a proper broadcast wave signal regardless of the magnitude of the pass band width FIF of an intermediate frequency circuit.

SUMMARY OF THE INVENTION

The present invention has been accomplished to solve the above-mentioned problem.

For example, the present invention provides a synthesizer receiver, comprising:

a variable band pass filter having the variable pass band width to which an intermediate frequency signal is supplied;

a first detection circuit for detecting the level of an adjacent broadcast wave signal based on the output signal of the variable band pass filter, and enables supplying the detected output to the band pass filter as a control signal for controlling the pass band width;

a second detection circuit for detecting the received electric field intensity based on the output signal of the band pass filter;

a counter for counting the frequency of the output signal of the variable band pass filter; and a control circuit to which an output signal according to the detected output of said second detection circuit and the count output of the counter is supplied, wherein:

the control circuit performs processing comprising the steps of:

allowing the detection signal of the first detection circuit to control the pass band width of the variable band pass filter to thereby check the detected output of the second detection circuit during execution of the seek, controlling the pass band width of the variable band pass filter to be switched to the wide band if the detected output of the second detection circuit indicates that the received electric field intensity is equal to or greater than a predetermined value as the checking result, and determining whether or not the detected output is tuned in to the broadcast wave signal based on the counter value of the counter, and controlling the seeking to stop if the determination result indicates that the detected output is turned in to the broadcast wave signal.

Therefore, the seeking will not be stopped erroneously even if there is a broadcast wave signal having high received electric field at the adjacent frequency. In other words, the seeking is stopped correctly and automatically even if there is a broadcast wave signal having high electric field intensity.

DESCRIPTION OF THE PREFERRED EMBODIMENTS

Figure 1:
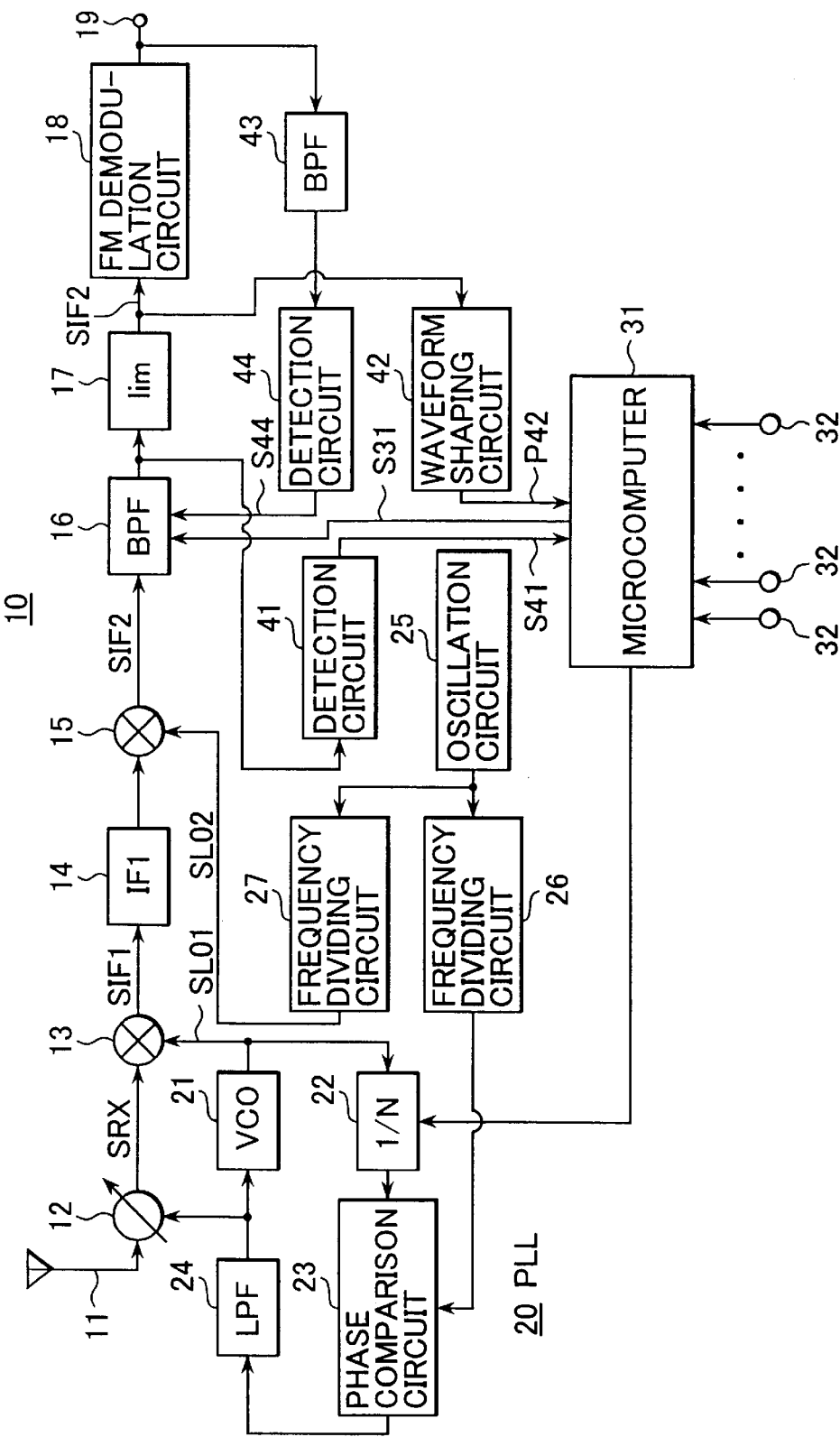
FIG. 1 is a block diagram illustrating one embodiment of the present invention.

In FIG. 1, the character 10 denotes an FM receiver having the synthesizer-type and double super heterodyne-type structure. A received signal received from an antenna 11 is supplied to an electronic tuning-type antenna tuning circuit 12, and a broadcast wave signal SRX having a target frequency fRX is extracted.

The signal SRX is supplied to a first mixer circuit 13, an oscillation signal SL01 having a frequency fL01

$$fL01 = fRX - fIF1 \qquad (1)$$

where fIF1 is the first intermediate frequency, for example, fIF1=10.7 MHz
is extracted from VCO 21, the signal SL01 is supplied to a mixer circuit 13 as the first local oscillation signal, and the signal SRX is subjected to frequency conversion and converted to a first intermediate frequency signal SIF1 (first intermediate frequency fIF1).

Subsequently, the first intermediate frequency signal SIF1 is supplied to a first intermediate frequency circuit 14. The first intermediate frequency circuit 14 having a wide pass band width of, for example, fIF1±90 kHz comprises, for example, a ceramic filter and an amplifier that are connected in cascade arrangement fashion.

The first intermediate frequency signal SIF1 sent out from the first intermediate frequency circuit 14 is supplied to a second mixer circuit 15, and a divided-frequency signal SL02 having a frequency fL02

$$fL02 = fIF1 - fIF2 \quad (2)$$

where fIF2 is the second intermediate frequency, for example, fIF2=450 kHz
is extracted from the frequency dividing circuit 27, the signal SL02 is supplied to a mixer circuit 15 as the second local oscillation signal, and the signal SIF1 is subjected to frequency conversion and converted to a second intermediate frequency signal SIF2 (second intermediate frequency fIF2).

Subsequently, the second intermediate frequency signal SIF2 is supplied to an FM demodulation circuit 18 through a variable band pass filter served for the second intermediate frequency circuit and a limiter amplifier 17, an audio signal is subjected to FM demodulation at that time, and the audio signal is supplied to a terminal 19. The characteristic of the variable band pass filter 16 will be described hereinafter.

At that time, voltage controlled oscillator (VCO) 21 constitutes PLL 20 together with circuits 22 to 24. In other words, the signal SL01 supplied from VCO 21 is supplied to the variable frequency dividing circuit 22 and divided into frequencies of 1/N, and the divided-frequency signal is supplied to a phase comparison circuit 23. Furthermore, at that time, an oscillation signal having a stable frequency is taken out from a quartz oscillation circuit 25, the oscillation signal is supplied to a frequency dividing circuit 26 to form a divided-frequency signal having a reference frequency Δf, for example, frequency of 100 kHz, and the divided-frequency signal is supplied to the comparison circuit 23 as the reference signal.

The comparison output of the comparison circuit 23 is supplied to VCO 21 through the low pass filter 24 as the control voltage. The output voltage of the filter 24 is supplied to the tuning circuit 12 as the tuning voltage, and the oscillation signal of the oscillation circuit 25 is supplied to a frequency dividing circuit 27 as the frequency dividing input.

Therefore, because the frequency of the divided-frequency signal supplied from the frequency dividing circuit 22 is equal to the frequency of the divided-frequency signal supplied from the frequency dividing circuit 26 in the steady state, the frequency fL01 of the oscillation signal SL01 is formulated as described herein under.

$$fL01 = N \times \Delta f \quad (3)$$

Based on the equations (1) and (3), $$fRX = fL01 + fIF1 = N \times 0.1 + 10.7 \text{ (MHz)}$$

Therefore, when the frequency dividing ratio is changed stepwise with step of 1 between 653 and 793, the local oscillation frequency fL01 changes stepwise with step of 100 kHz between 65.3 MHz and 79.3 MHz, and the received frequency fRX changes stepwise with frequency step of 100 kHz (=Δf) over the frequency band ranging from 76 MHz to 90 MHz correspondingly to the frequency dividing ratio N. Therefore, the FM broadcast band is sought by changing the frequency dividing ratio N stepwise with step of 1 in the above-mentioned range.

A microcomputer 31 is provided for controlling the system, various key operations (operation switch) 32 are connected, and the frequency dividing ratio N is supplied from the microcomputer 31 to the variable frequency dividing circuit 22. When the key 32 is operated, the microcomputer 31 functions to change the frequency dividing ratio N of the frequency dividing circuit 22 correspondingly to the operated key, and the received frequency fRX is changed thereby.

Figure 2:
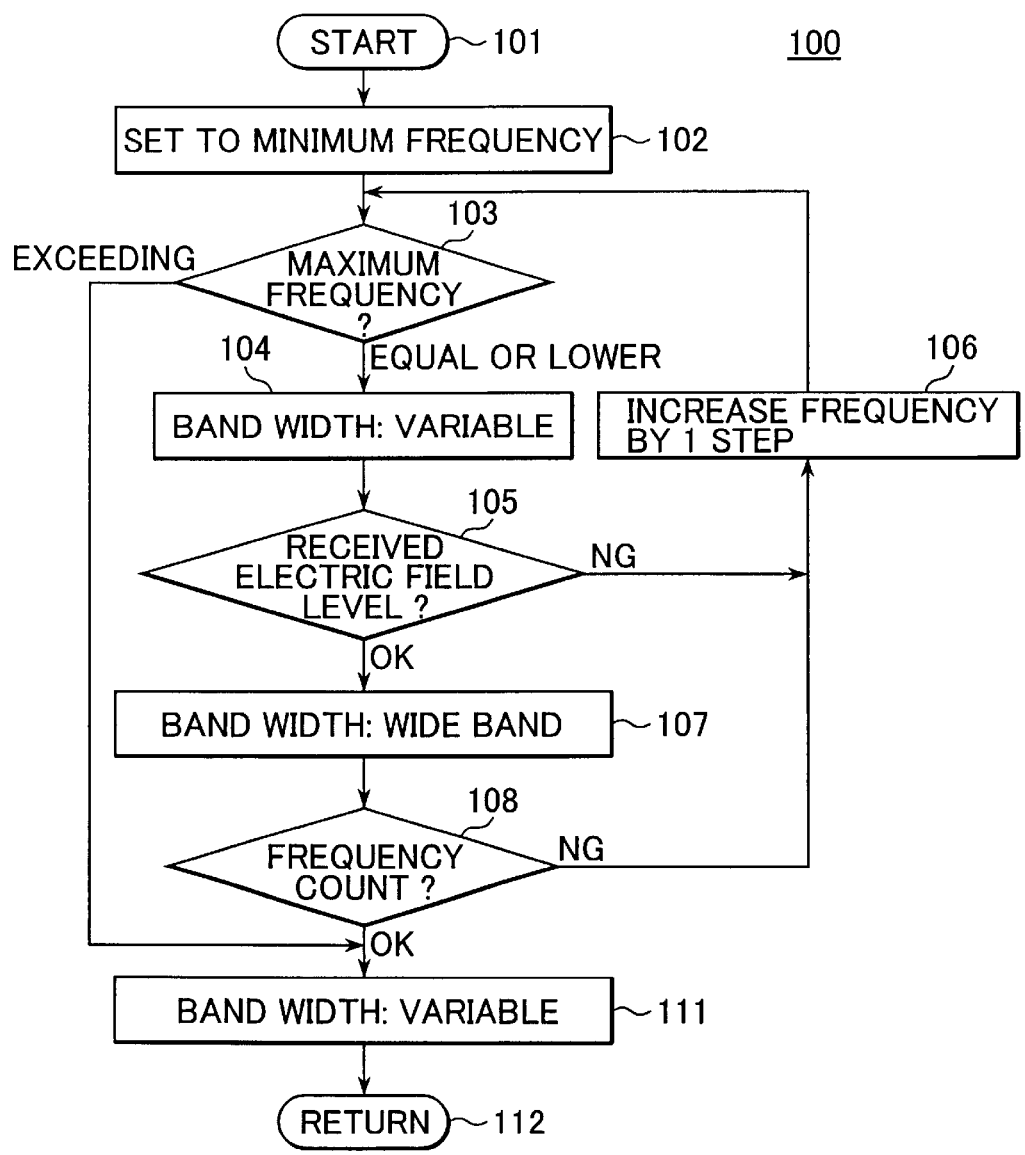
FIG. 2 is a flowchart describing one embodiment of the present invention.

Furthermore, the microcomputer 31 is provided with, for example, a seeking control routine 100 as shown in FIG. 2 as a part of the program to be executed by a central processing unit (CPU), not shown in the drawing. The routine 100 is served to realize seeking and seeking stop in the present invention. Though the detail of the routine 100 will be described hereinafter, only the part of the routine 100 that relates to the present invention is shown in FIG. 2.

Furthermore, the intermediate frequency signal SIF2 sent out from the band pass filter 16 is supplied to a detection circuit 41, a detection signal S41 for indicating whether the level of the intermediate frequency signal SIF1 is equal to or greater than a predetermined value or not, namely a detection signal S41 for indicating whether the received electric field intensity of the received signal SRX is equal to or greater than a predetermined value or not, is extracted, and the detection signal S41 is supplied to the microcomputer 31. Furthermore, the intermediate frequency signal SIF2 sent out from the limiter amplifier 17 is supplied to a waveform shaping circuit 42 so as to shape it to generate a pulse P42, and the pulse P42 is supplied to the microcomputer 31.

Furthermore, the demodulated output sent out from the demodulation circuit 18 is supplied to a band pass filter 43. The band pass filter 43 is served to detect a signal (beat frequency component) having the frequency adjacent to the received frequency fRX being received at that time. To perform the detection, the pass band of the band pass filter 43 ranges over a predetermined frequency range having the center at 100 kHz (=Δf), for example, range from 50 kHz to 200 kHz. The filter output is supplied to the detection circuit 44, and the level of the filter output is detected and extracted.

Figure 3:
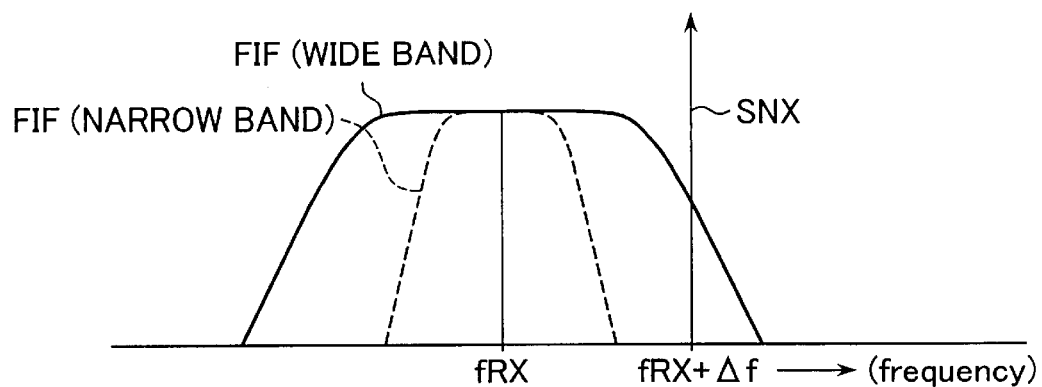
FIG. 3 is a characteristic diagram describing the present invention.

Therefore, for example, as shown in FIG. 3, when the frequency coincides with a certain received frequency fRX after seeking, if the pass bandwidth of the variable band pass filter 16 is wide (shown in FIG. 3 with a solid line) and a broadcast wave signal SNX having high received electric field intensity exists on the adjacent frequency (fRX+Δf), a part of the broadcast wave signal SNX is extracted from the band pass filter 43 as the filter output.

However, if the pass band width of the variable band pass filter 16 is narrow (for example, shown in FIG. 3 with a broken line), the output cannot be obtained from the band pass filter 43 even if a broadcast wave signal having high received electric field intensity exists on the adjacent frequency (fRX+Δf). Furthermore, even if the pass band width of the variable band pass filter 15 is wide, the output cannot be obtained from the band pass filter 43 if a broadcast wave signal having high electric field intensity does not exist.

Furthermore, at that time, the detection signal S44 that indicates the output level of the band pass filter 43 is extracted from the detection circuit 44.

The detection signal S44 is supplied to the variable band pass filter 16 as a control signal for controlling the pass band width, and the pass band width is continuously changed correspondingly to the level of the detection signal S44. The pass band of the band pass filter 16 is controlled to be narrow, for example, fIF2±10 kHz (for example, refer to the characteristic shown in FIG. 3 with a broken line) if the output of the filter 43 is large and the level of the detection signal S44 is high, and on the other hand the pass band of the band pass filter 16 is controlled to be wide if the output of the filter 43 is small and the level of the detection signal S44 is low, for example fIF2±90 kHz (for example, the characteristic shown in FIG. 3 with a solid line).

Furthermore, a predetermined control signal S31 is extracted from the microcomputer 31, and the signal S31 is supplied to the band pass filter 16. In this case, the control signal S31 sets any one of two modes described herein under to the pass band width of the variable band pass filter 16.

Control by use of the detection signal S44 is activated (referred to as "variable mode" hereinafter).

Control by use of the detection signal S44 is inactivated, and wide band is set (referred to as "wide band mode" hereinafter).

In the structure as described hereinabove, when an operation that requires the seeking in the FM broadcast band, for example, automatic tuning, is indicated by means of key operation of the key 32, the process of the CPU is started from step 101 of the routine 100 in the microcomputer 31, the frequency dividing ratio N of the variable frequency dividing circuit 22 is set to the minimum value in the next step 102. As the result, the received frequency fRX is set to the minimum frequency of 76 MHz.

Subsequently, whether the current received frequency fRX exceeds the maximum frequency 90 MHz or not is determined in step 103, and the sequence proceeds from step 103 to step 104 because the routine 100 just started and the received frequency fRX is set to the minimum frequency 76 MHz in step 102 in this case.

The control signal S31 functions to set the pass band width of the band pass filter 16 to the variable mode in step 104, and in the next step the detection signal S41 is checked to determine whether the received electric field strength at the current received frequency fRX is equal to or greater than a predetermined value or not.

If the received electric field intensity at the current received frequency fRX is lower than the predetermined value, then the sequence proceeds from step 105 to step 106, and in step 106 the frequency dividing ratio N is incremented by 1 and the received frequency fRX is concomitantly incremented by 1 step, namely by 100 kHz, and the sequence thereafter returns to step 103. Therefore, steps 103 to 106 are repeated until the broadcast having the received electric field intensity of the predetermined value is received. (Seeking state)

If the broadcast having the received electric field of the predetermined value is received, the value is determined in step 105, and the sequence proceeds from step 105 to step 107. The control signal S31 functions to set the pass band width of the band pass filter 16 to the wide band mode in step 107, and the number of pulse P42 is thereafter counted to thereby determine whether the received frequency fRX tunes in to the transmission frequency (carrier frequency) of the broadcast wave signal or not in step 108.

If the received frequency fRX does not tune in to the transmission frequency of the broadcast wave signal, then the sequence returns from step 108 to step 103 through step 106. Therefore, thereafter, steps 103 to 108 are repeated until the received frequency fRX tunes in to the broadcast having the received electric field intensity equal to or greater than the predetermined value.

If the received frequency fRX tunes in to the broadcast having the received electric field intensity equal to or greater than the predetermined value, then the sequence proceeds from step 108 to step 111, the control signal S31 functions to set the pass band width of the band pass filter 16 to the variable mode in step 111, and the routine 100 is thereafter brought to an end at step 112. Therefore, at that time, the seeking is stopped, and a broadcast station is selected automatically.

If the received frequency fRX exceeds the maximum frequency before the broadcast having the received electric field intensity equal to or greater than the predetermined value is not tuned in spite of repeated steps 103 to 108, then it is determined in step 103, the sequence proceeds from step 103 to step 111, and the routine 100 is brought to an end at step 112.

According to the routine 100, if the broadcast having the received electric field intensity equal to or greater than the predetermined value is tuned during the seeking, then the seeking is stopped at the received frequency fRX. In this case, because the pass band width of the band pass filter 16 used for selecting the second frequency signal SIF2 is switched to the variable mode or wide band mode, the seeking will not be stopped or will not pass the frequency at which the seeking should be stopped erroneously.

In other words, in the case that the received electric field intensity is checked in step 105, the pass band width of the band pass filter 16 is switched to the variable mode in step 104. Therefore, as shown in FIG. 3, if there is a broadcast wave signal SNX having high received electric field intensity at the adjacent frequency (fRX+Δf) at a certain receiving frequency fRX, then the detection signal S44 functions to narrow the pass band width of the band pass filter 16 as shown in FIG. 3 with a broken line. As the result, the broadcast wave signal SNX having high received electric field intensity of adjacent frequency (fRX+Δf) is removed from the detection signal S41.

Therefore, as shown in FIG. 3, even if there is a broadcast wave signal SNX having high received electric field intensity at the adjacent frequency (fRX+Δf), the broadcast wave signal SNX will not affect adversely on the step 104 and the received electric field intensity at the received frequency fRX is determined correctly, and as the result the seeking is not stopped erroneously at the received frequency fRX.

Figure 4:
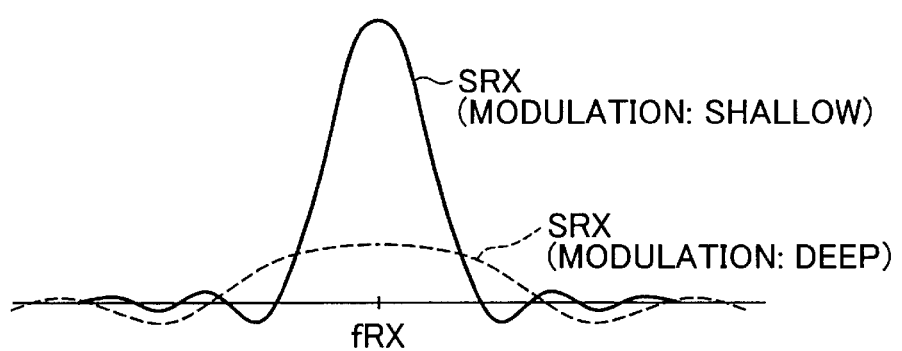
FIG. 4 is a characteristic diagram describing the present invention.

If there is no broadcast wave signal SNX having high received electric field intensity at the adjacent frequency (fRX+Δf) when the frequency comes to the received frequency fRX, the variable band pass filter 16 is switched to the wide band mode. Therefore, because the modulation of the broadcast wave signal SRX is deep, the frequency spectrum component is dispersed as shown in FIG. 4 with a broken line, and even if the energy of the broadcast wave signal SRX is dispersed, the detection signal S41 indicates a correct received electric field intensity of the broadcast wave signal SRX, and as the result the seeking is stopped properly.

Furthermore, when whether the received frequency fRX tunes in to the transmission frequency of the broadcast wave signal SRX or not is checked by counting the number of the pulse P42 in step 108, because the pass band width of the band pass filter 16 is switched to the wide band mode in step 107, the number of the pulse P42 is counted without any error.

In detail, in the case that the pass band width of the band pass filter 16 is switched to the variable mode, if there is a broadcast wave signal SNX having high received electric field intensity at the adjacent frequency (fRX+Δf) when the frequency comes to a certain received frequency fRX, the detection signal S44 functions to narrow the pass band width of the band pass filter 16 as shown in FIG. 3 with a broken line. As the result, the signal level at the received frequency fRX is lowered or reduced to 0, the number of the pulse P42 is counted erroneously and the correct count value cannot be obtained. That is true in the case that the pass band width of the band pass filter 16 is fixed to the narrow band mode.

However, in the routine 100, because the pass band width of the band pass filter 16 is switched to the wide band mode in step 107 and then the number of the pulse P42 is counted, when there is a broadcast wave signal SNX having high received electric field intensity at the adjacent frequency (fRX+Δf) the pass band width of the band pass filter 16 is wide and the signal level at the received frequency fRX is high. Therefore, the number of the pulse P42 is counted correctly.

As described hereinabove, according to the above-mentioned FM receiver, the seeking can be stopped correctly and automatically even if there is a broadcast wave signal SNX having high received electric field intensity.

The intermediate frequency signal SIF2 sent out from the band pass filter 16 is supplied to the detection circuit 41 to thereby obtain the detection signal S41 having the received electric field intensity in the above-mentioned embodiment, however, the intermediate frequency signal SIF2 may be extracted out from the middle of the limiter amplifier 17 and supplied to the detection circuit 41 to thereby obtain the detection signal S41.

The control signal S44 controls the band width so as to be switched by supplying the control signal S31 to the variable band pass filter 16 in the above-mentioned embodiment, however, the control signal S31 maybe supplied to the detection circuit 44 to control the band width so as to be switched similarly. Furthermore, for example, in the case that auto-preset is employed, in the step subsequent to step 111, the data for indicating the received frequency fRX being received at that time, for example, the frequency dividing ratio N is stored in a nonvolatile memory, and then the sequence proceeds to step 108.

What is claimed is:

1. A synthesizer receiver, comprising:
   a variable bandpass filter having a variable passband width to which an intermediate frequency signal of a desired broadcast wave signal is supplied;
   a first detection circuit for detecting a level of an adjacent broadcast wave signal based on an output signal of said variable bandpass filter and for enabling supplying a detected output to said bandpass filter as a control signal for controlling said passband width;
   a second detection circuit for detecting a received electric field intensity based on the output signal of said variable bandpass filter;
   a counter for counting a frequency of the output signal of said variable bandpass filter; and
   a control circuit to which the detected output of said second detection circuit and a count output of said frequency counter is supplied,
   wherein:
      said control circuit performs processing including the steps of:
         allowing a detection output signal of said first detection circuit to control the passband width of said variable bandpass filter to thereby check a detected output of said second detection circuit during execution of a seek operation,
         controlling the passband width of said variable band pass filter to be switched to a wide band when the detected output of said second detection circuit indicates that the received electric field intensity is equal to or greater than a predetermined value and determining whether the detected output is tuned to the desired broadcast wave signal based on the counter value of said frequency counter, and
         controlling said seek operation to stop when the detected result indicates that the detected output is tuned to the desired broadcast wave signal.

2. A synthesizer receiver in which a local oscillation frequency is changed by changing a frequency dividing ratio of a variable frequency dividing circuit in a phase-locked loop circuit to perform a seeking operation of a broadcast band and said seeking operation is stopped by stopping a change of said frequency dividing ratio, said receiver comprising:
   a variable bandpass filter having a variable passband width to which an intermediate frequency signal is supplied;
   a filter for extracting a signal having a frequency component when an adjacent broadcast wave signal is received from a demodulation output obtained by demodulating said intermediate frequency signal;
   a first detection circuit for detecting a level of an output signal of said variable bandpass filter;
   a second detection circuit for detecting a received electric field intensity based on the output signal of said variable bandpass filter;
   a frequency counter for counting a frequency of the output signal of said variable bandpass filter; and
   a control circuit to which an output signal according to the detected output of said second detection circuit and a count output of said frequency counter is supplied,
   wherein:
      a detected output of said first detection circuit is supplied to said variable bandpass filter as the control signal for controlling said width,
      said control circuit performs processing including the steps of:
         allowing a detection output signal of said first detection circuit to control the passband width of said variable bandpass filter to thereby check a detected output of said second detection circuit during execution of a seek operation;
         controlling the passband width of said variable band-pass filter to be switched to a wide band when the detected output of said second detection circuit indicates that the received electric field intensity is equal to or greater than a predetermined value, and determining whether the detected output is tuned to a desired broadcast wave signal based on the counter value of said frequency counter; and
         controlling said seek operation to stop when the detected result indicates that the detected output is tuned to the desired broadcast wave signal.

3. The synthesizer receiver as claimed in claim 2, wherein said broadcast band is an FM broadcast band, and said desired broadcast wave signal is an FM broadcast wave signal.

4. The synthesizer receiver as claimed in claim 3, wherein when said seek operation is stopped, the data indicating the received frequency that is being received at that time is stored in a memory.

* * * * *